United States Patent
Chang et al.

(10) Patent No.: US 10,147,807 B2
(45) Date of Patent: Dec. 4, 2018

(54) METHOD OF MANUFACTURING PIXEL STRUCTURE

(71) Applicant: Chunghwa Picture Tubes, LTD., Taoyuan (TW)

(72) Inventors: Hsi-Ming Chang, Taoyuan (TW); Yen-Yu Huang, Taoyuan (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 225 days.

(21) Appl. No.: 15/065,874

(22) Filed: Mar. 10, 2016

(65) Prior Publication Data

US 2017/0200813 A1 Jul. 13, 2017

(30) Foreign Application Priority Data

Jan. 8, 2016 (CN) .......................... 2016 1 0012509

(51) Int. Cl.
*H01L 21/02* (2006.01)
*H01L 21/443* (2006.01)
(Continued)

(52) U.S. Cl.
CPC .. *H01L 29/66969* (2013.01); *H01L 21/02565* (2013.01); *H01L 21/443* (2013.01); *H01L 21/47635* (2013.01); *H01L 29/24* (2013.01); *H01L 29/42356* (2013.01); *H01L 29/45* (2013.01); *H01L 29/7869* (2013.01); *H01L 29/78606* (2013.01)

(58) Field of Classification Search
CPC ........... H01L 29/7869; H01L 29/78693; H01L 29/4908; H01L 21/02631; H01L 27/3258; H01L 21/02266; H01L 27/3262; H01L 21/02667; H01L 29/045
See application file for complete search history.

(56) References Cited

U.S. PATENT DOCUMENTS

| | | | | |
|---|---|---|---|---|
| 5,429,685 A | * | 7/1995 | Saito | ................. H01L 31/03921 136/255 |
| 5,650,664 A | * | 7/1997 | Sakamoto | ......... H01L 23/53209 257/763 |

(Continued)

FOREIGN PATENT DOCUMENTS

TW 1469194 1/2015

*Primary Examiner* — Jay C Chang
(74) *Attorney, Agent, or Firm* — JCIPRNET

(57) ABSTRACT

A method of manufacturing a pixel structure is provided. A gate and a gate insulating layer are formed on a substrate. A channel layer is formed on the gate insulating layer, and the material of the channel layer includes a first metal oxide semiconductor material. A source and a drain are formed on opposite sides of the channel layer. An insulating layer has an opening exposing the drain. First and second transparent electrode material layers are formed on the substrate sequentially, the material of the first transparent electrode material layer includes a second metal oxide semiconductor material, and the material of the second transparent electrode material layer includes a metal oxide conductive material. The first and second transparent electrode material layers are patterned using the same mask to form first and second transparent electrode layers, wherein the first transparent electrode layer is in contact with the drain through the opening.

7 Claims, 3 Drawing Sheets

10

(51) Int. Cl.
*H01L 21/4763* (2006.01)
*H01L 29/66* (2006.01)
*H01L 29/786* (2006.01)
*H01L 29/423* (2006.01)
*H01L 29/24* (2006.01)
*H01L 29/45* (2006.01)

(56) References Cited

U.S. PATENT DOCUMENTS

| | | | |
|---|---|---|---|
| 6,294,722 B1 * | 9/2001 | Kondo | H01L 31/048 |
| | | | 136/244 |
| 8,658,479 B2 | 2/2014 | Kim et al. | |
| 2013/0029446 A1 * | 1/2013 | Kim | H01L 27/124 |
| | | | 438/34 |

* cited by examiner

METHOD OF MANUFACTURING PIXEL STRUCTURE

CROSS-REFERENCE TO RELATED APPLICATION

This application claims the priority benefit of China application serial no. 201610012509.7, filed on Jan. 8, 2016. The entirety of the above-mentioned patent application is hereby incorporated by reference herein and made a part of this specification.

BACKGROUND OF THE INVENTION

Field of the Invention

The invention provides a method of manufacturing an electronic component, and particularly relates to a method of manufacturing a pixel structure.

Description of Related Art

In recent years, it has been noted that a metal oxide semiconductor material has high electron mobility. Thus, it is suitable to applied to a thin film transistor in a pixel structure so as to be used as a channel layer. In a known method of manufacturing the pixel structure including the metal oxide semiconductor thin film transistor, a pixel electrode is usually formed after the metal oxide semiconductor thin film transistor is formed on a substrate. Generally, the pixel electrode is usually chosen from amorphous indium-tin oxide formed by a sputtering method, wherein a process gas used includes water or hydrogen. However, in ten is of the metal oxide semiconductor thin film transistor, water or hydrogen used when the film coating of amorphous indium-tin oxide is performed may change characteristics of a metal oxide semiconductor material layer, so that the metal oxide semiconductor material layer originally having semiconductor characteristics may be changed into the metal oxide semiconductor material layer having conductor characteristics, thereby causing conduction of the channel layer of the thin film transistor and affecting electrical performance and reliability of the thin film transistor.

SUMMARY OF THE INVENTION

The invention provides a method of manufacturing a pixel structure, so that the pixel structure has a good electrical performance and reliability.

The method of manufacturing the pixel structure of the invention includes the following steps. A gate is formed on a substrate. A gate insulating layer is formed on the substrate to cover the gate. A channel layer is formed on the gate insulating layer, wherein a material of the channel layer includes a first metal oxide semiconductor material. A source and a drain are formed on opposite sides of the channel layer. An insulating layer is formed on the substrate to cover the source, the drain, and the channel layer, wherein the insulating layer has an opening exposing the drain. A first transparent electrode material layer and a second transparent electrode material layer are formed on the substrate sequentially, wherein a material of the first transparent electrode material layer includes a second metal oxide semiconductor material, and a material of the second transparent electrode material layer includes a metal oxide conductive material. The first transparent electrode material layer and the second transparent electrode material layer are patterned using the same mask to form a first transparent electrode layer and a second transparent electrode layer, wherein the first transparent electrode layer is in contact with the drain through the opening.

Based on the above description, in the method of manufacturing the pixel structure of the invention, the first transparent electrode material layer of which material including the metal oxide semiconductor material and the second transparent electrode material layer of which material including the metal oxide conductive material are formed sequentially after the insulating layer is formed, so that the characteristics of the channel layer of which material including the metal oxide semiconductor material is not affected by water or hydrogen. Therefore, the pixel structure manufactured by the method of manufacturing the pixel structure of the invention has a good electrical performance and reliability.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
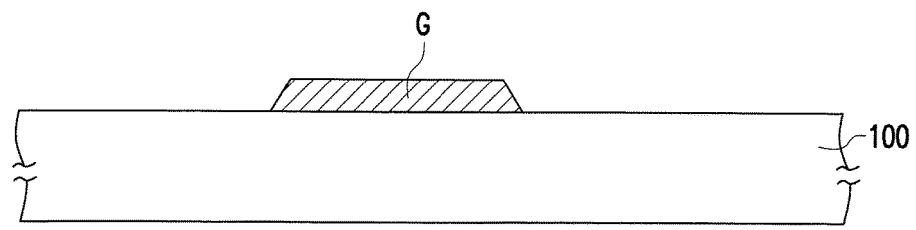
FIG. 1A to FIG. 1G are schematic cross-sectional views of a method of manufacturing a pixel structure according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1G are schematic cross-sectional views of a method of manufacturing a pixel structure according to an embodiment of the invention.

First, referring to FIG. 1A, a substrate 100 is provided. In terms of optical properties, the substrate 100 may be a light-transmissive substrate or an opaque/reflective substrate. The material of the light-transmissive substrate may be selected from glass, quartz, organic polymers, other suitable materials, or a combination thereof. The material of the opaque/reflective substrate may be selected from conductive materials, metal, wafers, ceramic, other suitable materials, or a combination thereof. It should be noted that, if the substrate 100 is chosen from the conductive materials, it is required to form an insulating layer (not shown) on the substrate 100 before the substrate 100 is equipped with elements, so that the problem of short circuit between the substrate 100 and the elements can be avoided.

Next, a gate G is formed on the substrate 100. Specifically, in the embodiment, the method of forming the gate G includes after forming a gate material layer (not shown) on the substrate 100 using a sputtering process, performing a first photolithography and etching process on the gate material layer, wherein the photolithography and etching process includes photo resist coating, exposure, development, etching, and stripping, etc. Additionally, in the embodiment, based on the consideration of conductivity, the material of the gate G is a metal material. The metal material is, for example, molybdenum, aluminum, titanium, an alloy of the above-mentioned metals, or a stack layer of at least two of the above-mentioned materials. However, the invention is not limited thereto. In other embodiments, the material of the gate G may be selected from other conductive materials (e.g. metal nitride, metal oxide, metal oxynitride) or a stack layer of metal with other conductive materials.

Figure 1B:
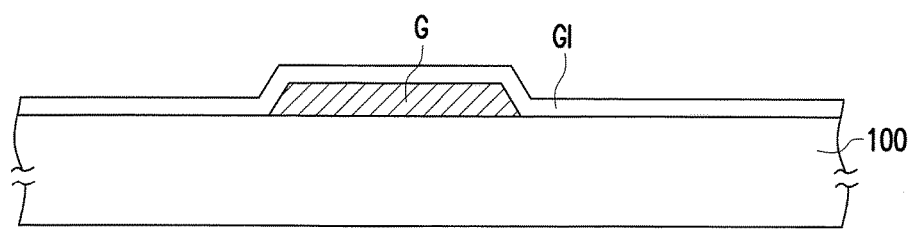

Then, referring to FIG. 1B, a gate insulating layer GI is formed on the substrate 100 to cover the gate G. In the embodiment, the gate insulating layer GI may be thoroughly deposited on the substrate 100 using physical vapor deposition (PVD) or chemical vapor deposition (CVD), wherein the chemical vapor deposition is plasma-enhanced chemical vapor deposition (PECVD), for example. Additionally, the material of the gate insulating layer GI includes such as silicon dioxide ($SiO_2$), silicon nitrides ($SiN_x$), or a stack layer thereof. In the embodiment, the gate insulating layer GI thoroughly covers the gate G and the substrate 100. However, the invention is not limited thereto.

Figure 1C:
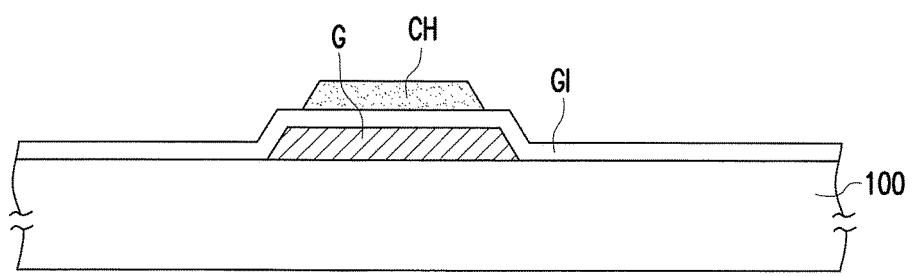

Then, referring to FIG. 1C, a channel layer CH is formed on the gate insulating layer GI, wherein the material of the channel layer CH includes a metal oxide semiconductor material. Specifically, in the embodiment, the method of forming the channel layer CH includes the following steps. First, a channel material layer (not shown) is formed on the gate insulating layer GI, wherein the material of the channel material layer includes a metal oxide semiconductor material. The metal oxide semiconductor material is, for example, indium-gallium-zinc oxide (IGZO) or indium trioxide ($In_2O_3$), and the method of forming the channel material layer includes a sputtering process or a coating process. Then, a second photolithography and etching process is performed on the channel material layer, wherein the photolithography and etching process includes photo resist coating, exposure, development, etching, and stripping, etc.

Figure 1D:
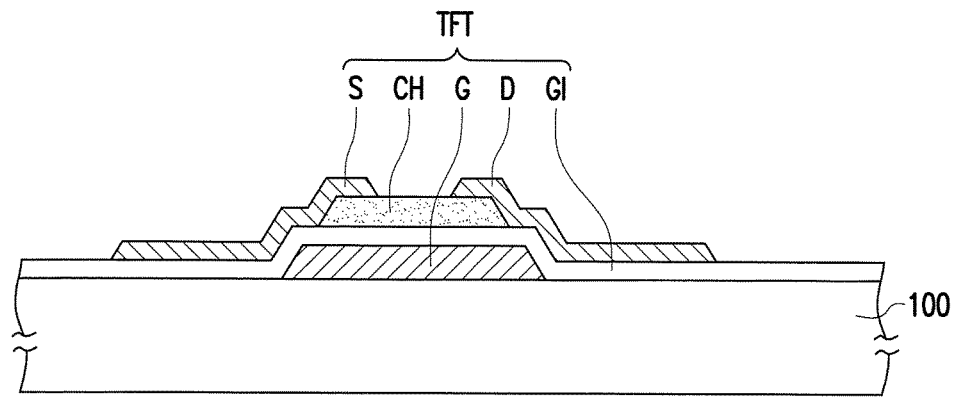

Then, referring to FIG. 1D, a source S and a drain D are formed on opposite sides of the channel layer CH. Specifically, the source S and the drain D are separated from each other, and a part of the channel layer CH is exposed.

In the embodiment, the method of forming the source S and the drain D includes after forming a conductive material layer (not shown) on the substrate 100 using a sputtering process, performing a third photolithography and etching process on the conductive material layer, wherein the photolithography and etching process includes photo resist coating, exposure, development, etching, and stripping, etc. Additionally, in the embodiment, based on the consideration of conductivity, the material of the source S and the drain D is metal material. The metal material is molybdenum, aluminum, titanium, an alloy of the above-mentioned metals, or a stack layer of at least two of the above-mentioned materials, for example. However, the invention is not limited thereto. In other embodiments, the material of the source S and the drain D may be selected from other conductive materials (e.g. metal nitride, metal oxide, metal oxynitride) or stack layers of metal with other conductive materials.

It should be further noted that, in the embodiment, the gate G, the gate insulating layer GI, the channel layer CH, the source S, and the drain D constitute a thin film transistor TFT. In particular, in the embodiment, since the material of the channel layer CH includes the metal oxide semiconductor material, the thin film transistor TFT is a metal oxide semiconductor thin film transistor. From another point of view, in the embodiment, the thin film transistor TFT belongs to a back-channel-etch type.

Figure 1E:
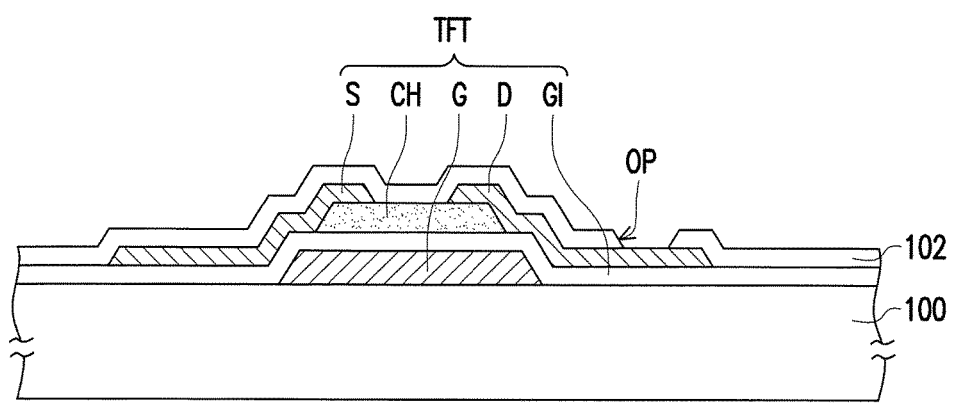

Then, referring to FIG. 1E, an insulating layer 102 is formed on the substrate 100 to cover the source S, the drain D, and the channel layer CH, wherein the insulating layer 102 has an opening OP exposing the drain D. Specifically, in the embodiment, the method of forming the insulating layer 102 includes the following steps. First, an insulating material layer (not shown) is thoroughly formed on the substrate 100, wherein the material of the insulating material layer includes silicon dioxide or other suitable insulating materials, and the insulating material layer may be formed by plasma-enhanced chemical vapor deposition (PECVD). Then, a fourth photolithography and etching process is performed on the insulating material layer to form the above-mentioned opening OP, wherein the photolithography and etching process includes photo resist coating, exposure, development, etching, and stripping, etc. Additionally, in the embodiment, the thickness of the insulating layer 102 is between 200 Å and 2000 Å, for example.

Figure 1F:
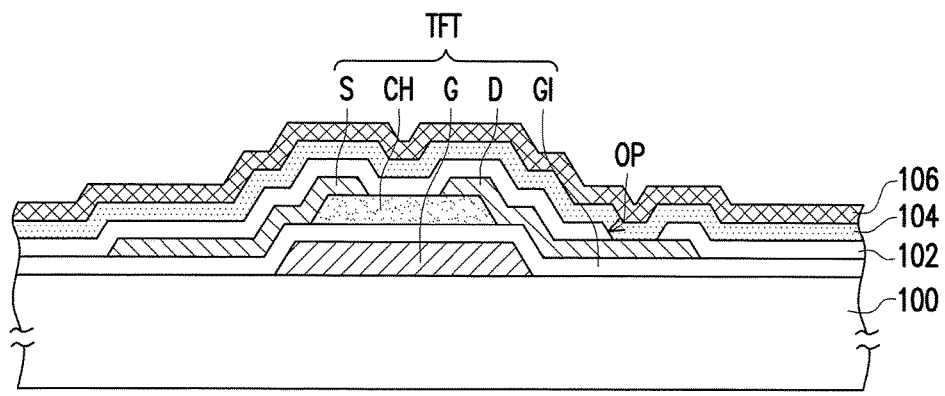

Then, referring to FIG. 1F, a first transparent electrode material layer 104 and a second transparent electrode material layer 106 are formed on the substrate 100 sequentially. Specifically, in the embodiment, the method of forming the first transparent electrode material layer 104 includes a sputtering process or a coating process. The material of the first transparent electrode material layer 104 includes a metal oxide semiconductor material. The metal oxide semiconductor material is, for example, indium-gallium-zinc oxide (IGZO) or indium trioxide ($In_2O_3$). The thickness of the first transparent electrode material layer 104 is between 50 Å and 500 Å. More specifically, when the first transparent electrode material layer 104 is formed using the sputtering process, a process gas is argon or a mixed gas of argon and oxygen.

It should be noted that, as mentioned above, when the first transparent electrode material layer 104 is formed using the sputtering process, only argon or the mixed gas of argon and oxygen may be used as the process gas while water or hydrogen may not be used. Therefore, whether using the sputtering process or the coating process to form the first transparent electrode material layer 104, water plasma or hydrogen plasma which may change characteristics of the channel layer CH (i.e. the metal oxide semiconductor material) may not exist during the process.

Additionally, in the embodiment, the method of forming the second transparent electrode material layer 106 includes a sputtering process. The material of the second transparent electrode material layer 106 includes a metal oxide conductive material. The metal oxide conductive material is amorphous indium-tin oxide (a-ITO), for example. In particular, when the second transparent electrode material layer 106 is formed using the sputtering process, not only argon or a mixed gas of argon and oxygen is used as a process gas, but also water or hydrogen is used as a process gas.

It should be noted that, as mentioned above, the water plasma or the hydrogen plasma may be produced during the process of forming the second transparent electrode material layer 106 using the sputtering process, but since the second transparent electrode material layer 106 is formed after the first transparent electrode material layer 104, and at least the insulating layer 102 exists between the first transparent electrode material layer 104 and the channel layer CH, the channel layer CH (i.e. the metal oxide semiconductor material) can effectively prevent from being affected by the water plasma or the hydrogen plasma, so that the thin film transistor TFT does not have a problem of electrical drift but has a good electrical performance and reliability. It should be further noted that, the water plasma or the hydrogen plasma produced during the process of forming the second transparent electrode material layer 106 enables the metal oxide semiconductor material in the first transparent electrode material layer 104 to be conductive, thereby enhancing the conductivity of the first transparent electrode material layer 104. That is, by the water plasma or the hydrogen plasma produced during the process of forming the second transparent electrode material layer 106, the first transparent electrode material layer 104 originally having semiconductor characteristics may be changed into the first transparent electrode material layer 104 having conductor characteristics.

Figure 1G:
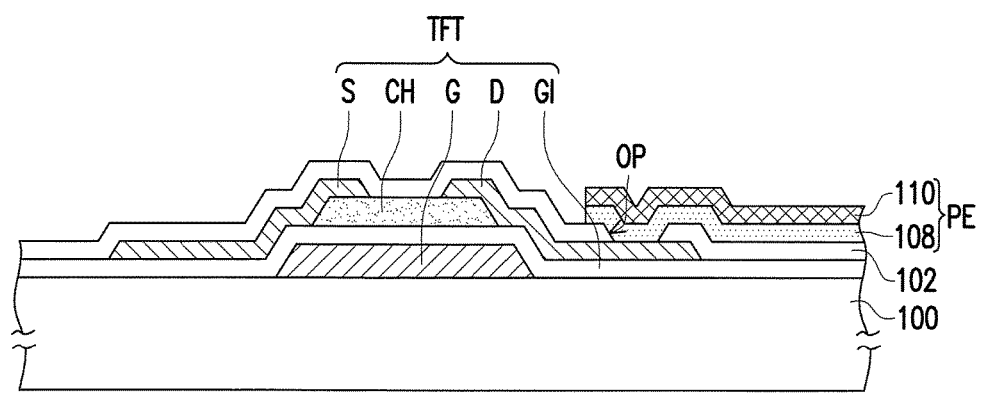

Then, referring to FIG. 1G, the first transparent electrode material layer 104 and the second transparent electrode material layer 106 are patterned using the same mask to form a first transparent electrode layer 108 and a second transparent electrode layer 110, wherein the first transparent electrode layer 108 is in contact with the drain D through the opening OP. Specifically, in the embodiment, the method of forming the first transparent electrode layer 108 and the second transparent electrode layer 110 includes performing a fifth photolithography and etching process on the first transparent electrode material layer 104 and the second transparent electrode material layer 106. The fifth photolithography and etching process includes photo resist coating, exposure, development, etching, and stripping, etc., wherein a photo resist is coated on the second transparent electrode material layer 106. The exposure step is to perform exposure on the photo resist coated on the second transparent electrode material layer 106 using the fifth mask. The etching step is to perform etching both on the first transparent electrode material layer 104 and the second transparent electrode material layer 106, and an etching solution is oxalic acid, for example.

Furthermore, in the embodiment, the first transparent electrode layer 108 and the second transparent electrode layer 110 are in contact with each other directly, and the first transparent electrode layer 108 and the second transparent electrode layer 110 are formed by using the same mask (i.e. the fifth mask), thus the first transparent electrode layer 108 and the second transparent electrode layer 110 have the same pattern. In other words, in the embodiment, the second transparent electrode layer 110 completely covers the first transparent electrode layer 108.

Additionally, in the embodiment, the first transparent electrode layer 108 and the second transparent electrode layer 110 together constitute a pixel electrode PE electrically connected to the drain D. It should be noted that, as mentioned above, the water plasma or the hydrogen plasma produced during the process of forming the second transparent electrode material layer 106 enables the first transparent electrode material layer 104 originally having semiconductor characteristics to be conductive, thereby enhancing the conductivity of the first transparent electrode layer 108. Thus, the pixel electrode PE which is composed of the first transparent electrode layer 108 and the second transparent electrode layer 110 has a good conductivity.

Then, after the first transparent electrode layer 108 and the second transparent electrode layer 110 are formed, a crystallization process which is performed on the second transparent electrode layer 110 is further included. In the embodiment, the crystallization process includes performing a high temperature treatment. The temperature of the high temperature treatment is about 150° C. to 300° C. Specifically, in the embodiment, by performing the crystallization process on the second transparent electrode layer 110, the crystallinity of the second transparent electrode layer 110 is better, thereby enhancing the conductivity of the second transparent electrode layer 110. Additionally, in the embodiment, even though the crystallization process is performed on the second transparent electrode layer 110 after the first transparent electrode layer 108 and the second transparent electrode layer 110 are formed, the invention is not limited thereto.

Based on the above description, after performing all the above-mentioned steps (FIG. 1A to FIG. 1G), the manufacture of the pixel structure 10 of the embodiment can be completed. In the above-mentioned embodiments, the manufacture of the pixel structure 10 can be completed by five photolithography and etching processes. It should be noted that, as mentioned above, by forming the first transparent electrode material layer 104 that the water plasma and the hydrogen plasma may not be produced during the manufacturing process thereof after forming the insulating layer 102, even though the water plasma and the hydrogen plasma may be produced during the process of forming the second transparent electrode material layer 106, the channel layer CH (i.e. the metal oxide semiconductor material) still can effectively prevent from being affected by the water plasma or the hydrogen plasma. Thereby, the thin film transistor TFT can avoid from the problem of electrical drift. Therefore, the pixel structure 10 has a good electrical performance and reliability compared with the known pixel structures.

In summary, in the method of manufacturing the pixel structure of the invention, the first transparent electrode material layer of which material including the metal oxide semiconductor material and the second transparent electrode material layer of which material including the metal oxide conductive material are formed sequentially after the insulating layer is formed, so that the characteristics of the channel layer of which material including the metal oxide semiconductor material is not affected by water or hydrogen. Therefore, the pixel structure manufactured by the method of manufacturing the pixel structure of the invention has a good electrical performance and reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a pixel structure, comprising:
    forming a gate on a substrate;
    forming a gate insulating layer on the substrate to cover the gate;
    forming a channel layer on the gate insulating layer, wherein a material of the channel layer comprises a first metal oxide semiconductor material;
    forming a source and a drain on opposite sides of the channel layer;
    forming an insulating layer on the substrate to cover the source, the drain, and the channel layer, wherein the insulating layer has an opening exposing the drain;
    forming a first transparent electrode material layer and a second transparent electrode material layer on the substrate sequentially, wherein a material of the first transparent electrode material layer comprises a second metal oxide semiconductor material, a material of the second transparent electrode material layer comprises a metal oxide conductive material, a method of forming the first transparent electrode material layer comprises a sputtering process or a coating process, and a method of forming the second transparent electrode material layer comprises a sputtering process, wherein a process gas is argon or a mixed gas of argon and oxygen when the first transparent electrode material layer is formed using the sputtering process;

patterning the first transparent electrode material layer and the second transparent electrode material layer using the same mask to form a first transparent electrode layer and a second transparent electrode layer, wherein the first transparent electrode layer is in contact with the drain through the opening; and performing a crystallization process on the second transparent electrode layer.

2. The method of manufacturing the pixel structure according to claim 1, wherein the first metal oxide semiconductor material comprises indium-gallium-zinc oxide or indium trioxide.

3. The method of manufacturing the pixel structure according to claim 1, wherein the second metal oxide semiconductor material comprises indium-gallium-zinc oxide or indium trioxide.

4. The method of manufacturing the pixel structure according to claim 1, wherein the metal oxide conductive material comprises amorphous indium-tin oxide.

5. The method of manufacturing the pixel structure according to claim 1, wherein the first transparent electrode layer and the second transparent electrode layer have the same pattern.

6. The method of manufacturing the pixel structure according to claim 1, wherein the first transparent electrode layer and the second transparent electrode layer are in contact with each other directly.

7. The method of manufacturing the pixel structure according to claim 1, wherein a thickness of the insulating layer is between 200 Å and 2000 Å, and a thickness of the first transparent electrode material layer is between 50 Å and 500 Å.

* * * * *